(12) United States Patent
Hu et al.

(10) Patent No.: US 12,254,934 B2
(45) Date of Patent: Mar. 18, 2025

(54) MEMORY DEVICE AND COMPENSATION METHOD OF DATA RETENTION THEREOF

(71) Applicant: MACRONIX International Co., Ltd., Hsinchu (TW)

(72) Inventors: Chih-Wei Hu, Miaoli County (TW); Chih-Chang Hsieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 155 days.

(21) Appl. No.: 18/180,874

(22) Filed: Mar. 9, 2023

(65) Prior Publication Data

US 2024/0304264 A1  Sep. 12, 2024

(51) Int. Cl.
*G11C 17/00* (2006.01)
*G11C 16/10* (2006.01)
*G11C 16/26* (2006.01)
*G11C 16/34* (2006.01)

(52) U.S. Cl.
CPC ........ *G11C 16/3481* (2013.01); *G11C 16/102* (2013.01); *G11C 16/26* (2013.01)

(58) Field of Classification Search
CPC ........ H10B 41/35; H10B 41/41; H10B 43/30; H10B 43/35; H10B 43/40; G11C 16/0466; G11C 16/0483; G11C 16/30; G11C 16/10; G11C 16/26; G11C 11/5628; G11C 11/5635; G11C 11/5642; G11C 11/5671; G11C 16/08; G11C 16/16; G11C 16/24; G11C 16/3445; G11C 16/3459; G11C 16/3495; G11C 2211/5621; G11C 11/40; G11C 16/0475; G11C 16/14; G11C 16/06; G11C 16/3481; G11C 11/5621; G11C 16/102; G11C 16/3436; G11C 16/3477
See application file for complete search history.

(56) References Cited

U.S. PATENT DOCUMENTS

| 5,768,193 | A | 6/1998 | Lee et al. |
| 6,493,270 | B2 | 12/2002 | Chevallier |
| 6,650,585 | B2 | 11/2003 | Chevallier |
| 11,017,851 | B1 * | 5/2021 | Prabhakar ........... H01L 29/7923 |

FOREIGN PATENT DOCUMENTS

| EP | 3404661 | 11/2018 |
| TW | 202221901 | 6/2022 |

OTHER PUBLICATIONS

"Office Action of Taiwan Counterpart Application", issued on Jan. 16, 2024, pp. 1-4.

* cited by examiner

*Primary Examiner* — Thong Q Le
(74) *Attorney, Agent, or Firm* — J.C. PATENTS (57) ABSTRACT

A memory device, such as a 3D AND type flash memory, and a compensation method of data retention thereof are provided. The compensation method includes the following. A reading operation is performed on each of a plurality of programmed memory cells of the memory device. Whether a charge loss phenomenon occurs in the programmed memory cells is determined through the reading operation to set the programmed memory cells to be charge loss memory cells. A refill program operation is performed on the charge loss memory cells.

16 Claims, 6 Drawing Sheets

- S110: Perform a reading operation on each of a plurality of programmed memory cells in a memory device
- S120: Determine whether a charge loss phenomenon occurs in the programmed memory cells through the reading operation to set the programmed memory cells to be charge loss memory cells
- S130: Perform a refill program operation on the charge loss memory cells

MEMORY DEVICE AND COMPENSATION METHOD OF DATA RETENTION THEREOF

BACKGROUND

Technical Field

The disclosure relates to a memory device and a compensation method thereof. Particularly, the disclosure relates to a memory device compensating data retention through a refill program operation and a compensation method thereof.

Description of Related Art

With the advancement of electronic technology, electronic products have become an important tool in people's lives. To provide a large amount of reliable data information, it is an inevitable trend to dispose a memory device with high reliability in the electronic products.

In technical fields at present, a flash memory device as a data storage medium has become a mainstream in the electronic devices. However, reliability of flash memory cells may be reduced under a high program and erase cycle (PE cycle). Flash memory cells with reduced reliability may have a reduced charge retention capability, and charge loss may occur in the memory cells under long-term storage, resulting in reduced data retention.

SUMMARY

The disclosure provides a memory device and a compensation method of data retention thereof, which may effectively maintain stored charges of programmed memory cells.

According to an embodiment of the disclosure, a compensation method of data retention includes the following. A reading operation is performed on each of a plurality of programmed memory cells of a memory device. Whether a charge loss phenomenon occurs is determined in the programmed memory cells through the reading operation to set the programmed memory cells to be charge loss memory cells. A refill program operation is performed on the charge loss memory cells.

According to an embodiment of the disclosure, a memory device includes a memory block and a controller. The controller is coupled with the memory block. The controller is configured to perform a reading operation on each of a plurality of programmed memory cells in the memory device; determine whether a charge loss phenomenon occurs in the programmed memory cells through the reading operation to set the programmed memory cells to be charge loss memory cells; and perform a refill program operation on the charge loss memory cells.

Based on the foregoing, according to an embodiment of the disclosure, the memory device detects the charge loss state of the memory cells, and performs the refill program operation on the charge loss memory cells when the charge loss phenomenon is detected to occur in the memory cells. In this way, the charge loss phenomenon in the memory cells may be compensated for, and the reliability of data can be maintained.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
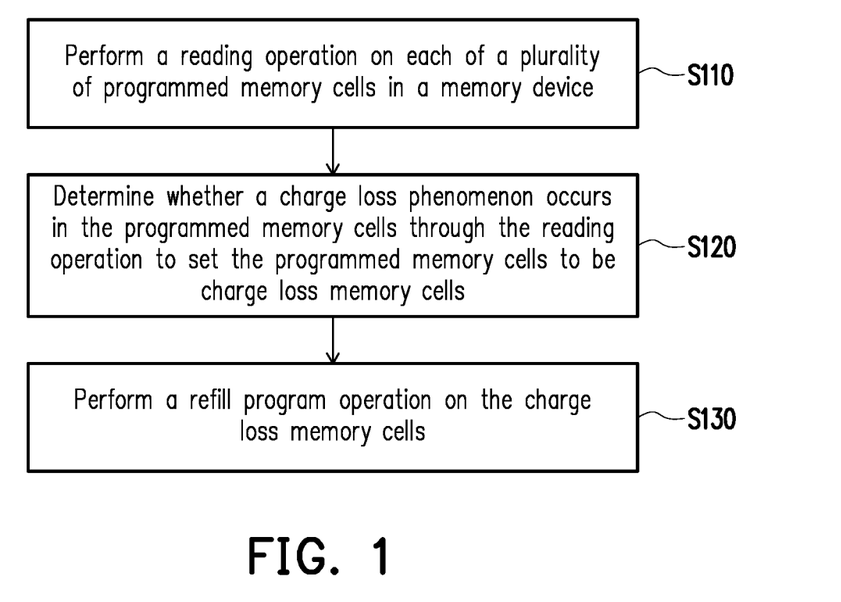
FIG. 1 is a flowchart of a compensation method of data retention according to an embodiment of the disclosure.

With reference to FIG. 1, FIG. 1 is a flowchart of a compensation method of data retention according to an embodiment of the disclosure. In step S110, a reading operation may be performed on each of a plurality of programmed memory cells in a memory device. In step S120, whether a charge loss phenomenon occurs in the programmed memory cells may be determined through the reading operation, and the programmed memory cells may be set to be charge loss memory cells according to whether a charge loss phenomenon occurs in the programmed memory cells. To be specific, in the embodiment of the disclosure, a detection operation of whether a charge loss phenomenon occurs may be performed on all programmed memory cells in the entire memory device. The detection operation of a charge loss phenomenon may be performed by the reading operation performed on the programmed memory cells. The shift state of a threshold voltage of the programmed memory cells may be detected through the reading operation. In the embodiment of the disclosure, a first threshold voltage and a second threshold voltage may be first set in the memory device, where the second threshold voltage is greater than the first threshold voltage, and the second threshold voltage may be less than a program verifying voltage in the previously performed programming operation on the programmed memory cells. The memory device may also determine whether the threshold voltage of the detected programmed memory cells falls within a range of the first threshold voltage to the second threshold voltage. When the threshold voltage of the detected programmed memory cells falls within the range of the first threshold voltage to the second threshold voltage, the memory device may determine that a charge loss phenomenon has occurred in the detected programmed memory cells, and the detected programmed memory cells may be set to be charge loss memory cells. When the threshold voltage of the detected programmed memory cells does not fall within the range of the first threshold voltage to the second threshold voltage, the memory device does not set the detected programmed memory cells to be charge loss memory cells.

In other embodiments of the disclosure, the detection operation of a charge loss phenomenon may be performed based on a plurality of regions in the memory device. Each region in the memory device may be an erased region and a programmed region. The memory device may perform a reading operation on programmed memory cells in the programmed region to determine whether each programmed memory cell is a charge loss memory cell. The memory device may not perform a reading operation on the erased region.

Next, in step S130, the memory device may perform a refill program operation on the charge loss memory cells, and perform a charge refill operation on the charge loss memory cells through the refill program operation, completing the compensation operation of data retention of the memory cells.

In this embodiment, the memory device may set a program voltage in the refill program operation, and provide a single pulse having the program voltage to perform the refill program operation on the charge loss memory cells. In this embodiment, the program voltage in the refill program operation may be greater than a program verifying voltage in a refill program verifying operation. The program verifying voltage may be set according to the second threshold. For example, the program verifying voltage may be equal to the second threshold.

In other embodiments, the memory device may also perform the refill program operation on the charge loss memory cells through an incremental step pulse programming (ISPP) mechanism. The operation details of the incremental step pulse programming mechanism may be performed in a manner known to those ordinarily skilled in the art, and are not particularly limited.

Figure 2:
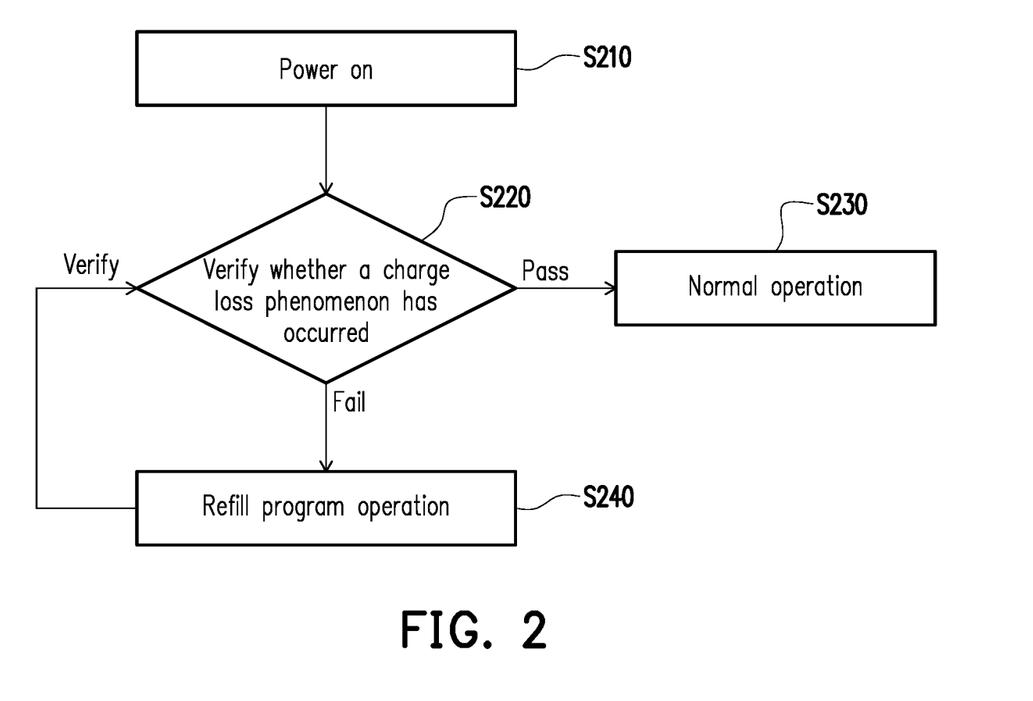
FIG. 2 is a flowchart of a compensation method of data retention of a memory device according to another embodiment of the disclosure.
Figure 3A:
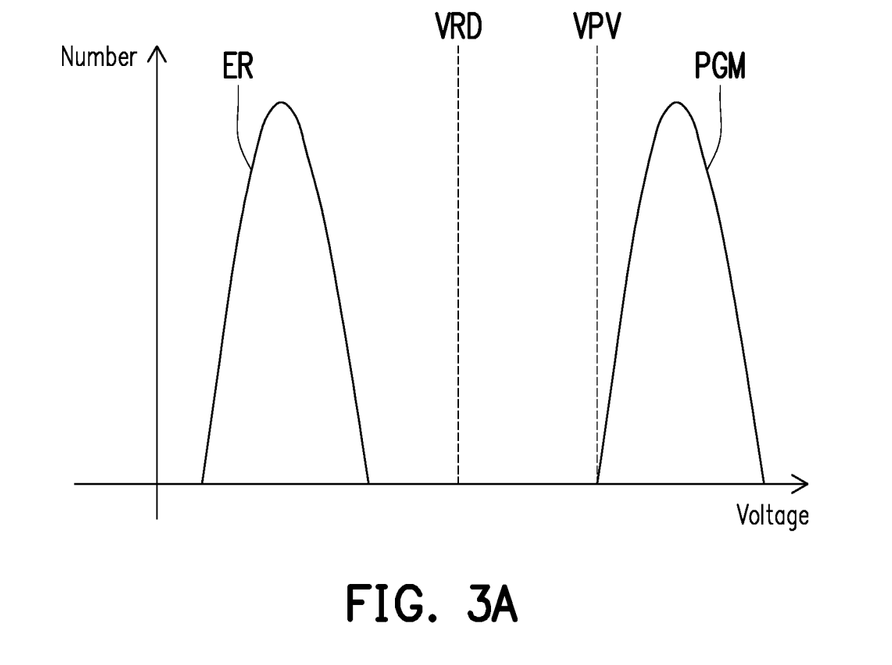
FIG. 3A to FIG. 3C are schematic diagrams of compensation operations of data retention of a memory device.
Figure 3B:
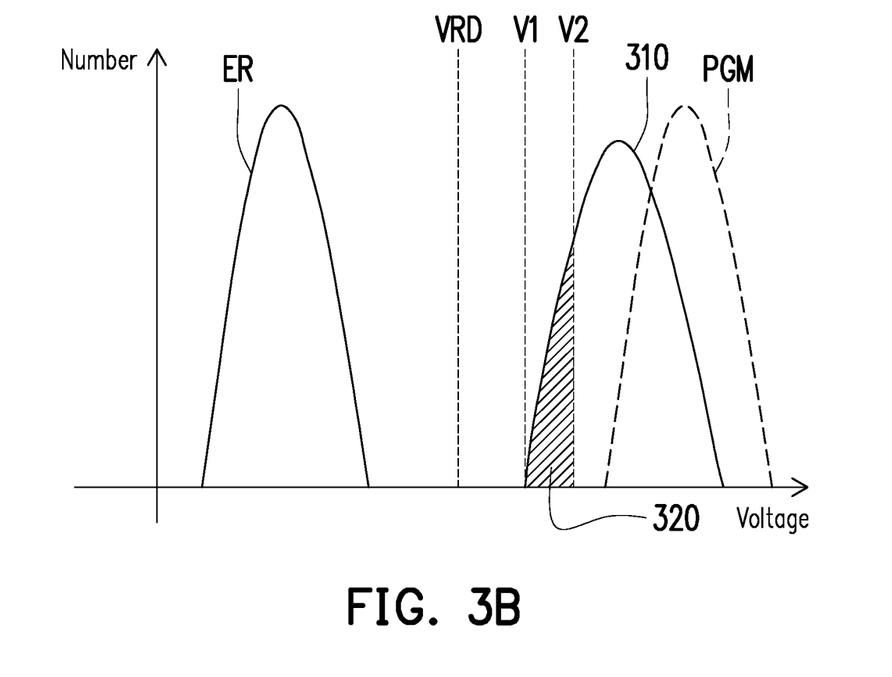
Figure 3C:
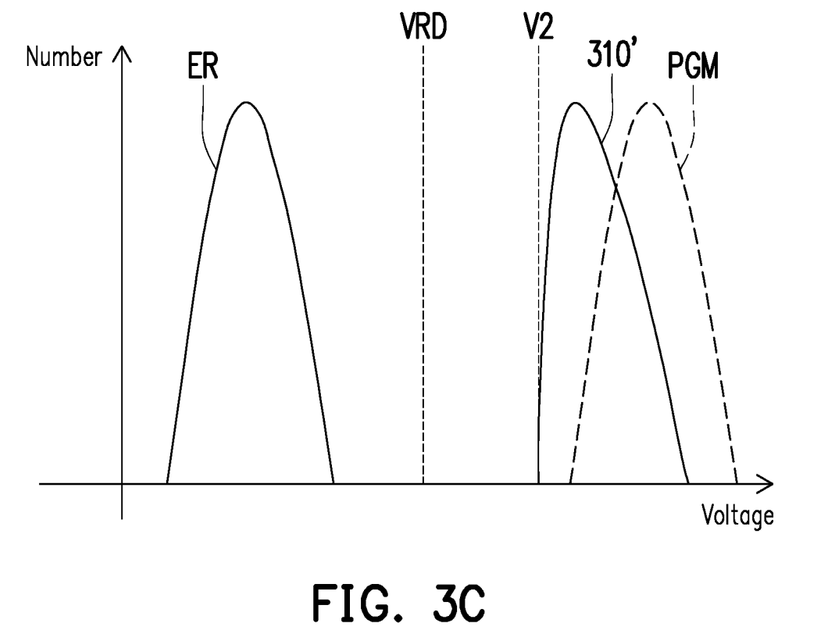

Next, with reference to FIG. 2, FIG. 2 is a flowchart of a compensation method of data retention of a memory device according to another embodiment of the disclosure. In step S210, the memory device is powered on. In step S220, the memory device may perform a verifying operation of whether a charge loss phenomenon has occurred in programmed memory cells. Here, reference may be made to FIG. 2 and FIG. 3A to FIG. 3C together. FIG. 3A to FIG. 3C are schematic diagrams of compensation operations of data retention of a memory device. In FIG. 3A to FIG. 3C, the horizontal axis represents the voltage value of the threshold voltage of the memory cells, and the vertical axis represents the number of memory cells. In FIG. 3A, distribution lines of memory cells in the memory device are divided into an erased region memory cell distribution line ER and a programmed memory cell distribution line PGM. The threshold voltage of the memory cells in the programmed memory cell distribution line PGM is greater than a program verifying voltage VPV. A reading reference voltage VRD for performing a reading operation on the memory cells is set between the erased region memory cell distribution line ER and the programmed memory cell distribution line PGM, and has a sufficient distance from the programmed memory cell distribution line PGM as a read margin.

In FIG. 3B, a charge loss phenomenon may occur in some of the programmed memory cells in the programmed memory cell distribution line PGM due to at least one factor including an environmental factor, a usage time, or the number of counts of being read, for example, and a programmed memory cell distribution line 310 is generated. At this time, by performing step S220, a controller in the memory device may set a first threshold voltage V1 and a second threshold voltage V2, and determine a plurality of charge loss memory cells 320 having a threshold voltage within a range of the first threshold voltage V1 to the second threshold voltage V2 by performing a reading operation on the programmed memory cells.

With reference to FIG. 2 again, in step S230, when the verifying operation in step S220 is passed (indicating that the verified programmed memory cells are not charge loss memory cells), step S230 may be performed to perform a normal operation.

When the verifying operation of step S220 fails (indicating that the verified programmed memory cells are charge loss memory cells), step S240 may be performed to perform a refill program operation on the charge loss memory cells.

For the details of the refill program operation, with reference to FIG. 3C, following the embodiment of FIG. 3B, when the controller of the memory device determines charge loss memory cells 320, the controller may perform a refill program operation on the charge loss memory cells 320. The controller may set a program verifying voltage equal to the second threshold voltage V2, and perform a refill program operation on the charge loss memory cells 320 by providing a pulse having a program voltage to the charge loss memory cells 320. Here, the program voltage may be greater than the second threshold voltage V2. Alternatively, the controller may perform a refill program operation on the charge loss memory cells 320 through an incremental step pulse programming mechanism by providing a plurality of pulses having an increasing voltage.

After the refill program operation is completed, a programmed memory cell distribution line 310' may be obtained.

Figure 4A:
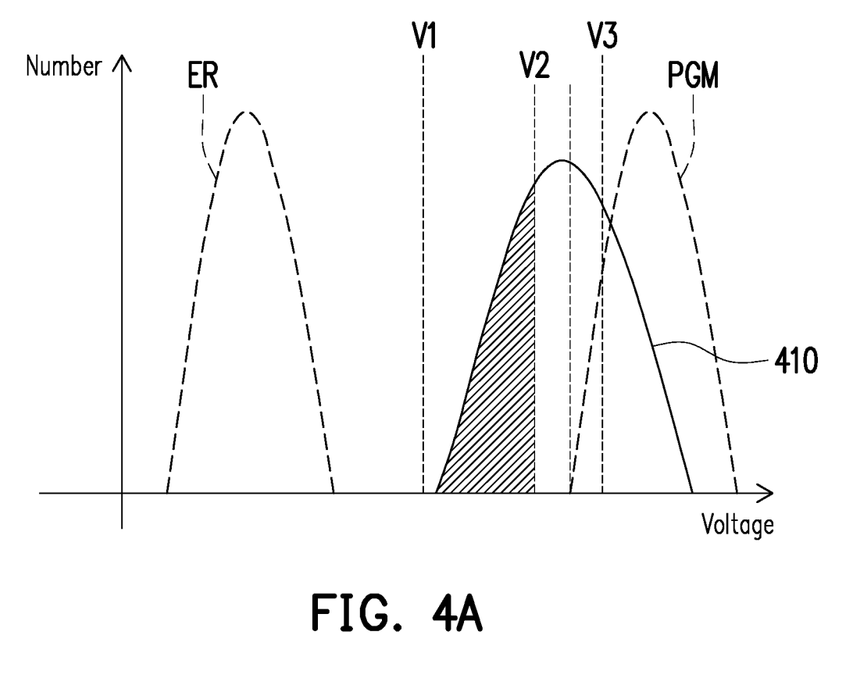
FIG. 4A and FIG. 4B are schematic diagrams of compensation operations of data retention of a memory device according to another embodiment of the disclosure.
Figure 4B:
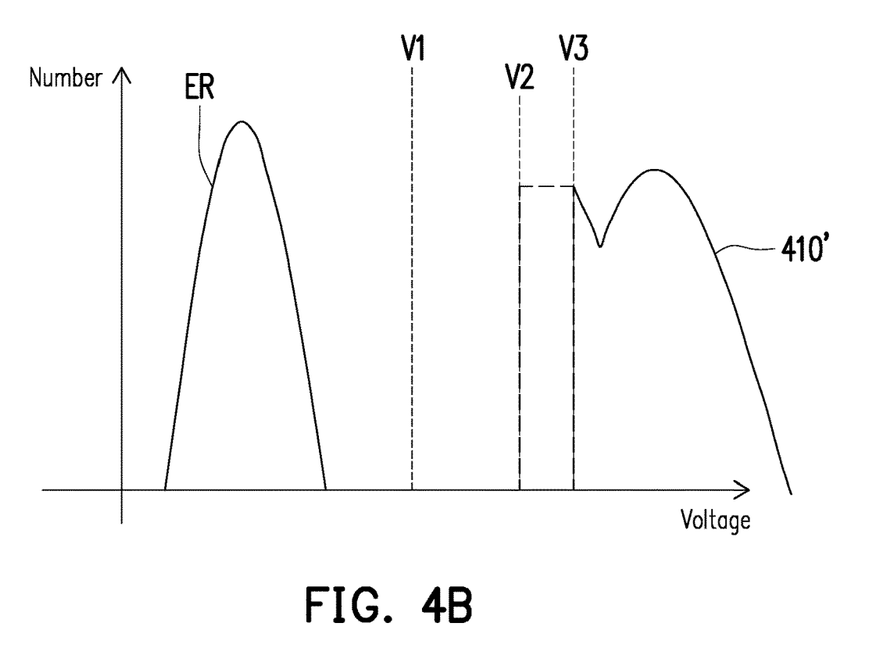

Next, with reference to FIG. 4A and FIG. 4B, FIG. 4A and FIG. 4B are schematic diagrams of compensation operations of data retention of a memory device according to another embodiment of the disclosure. In FIG. 4A, a controller of the memory device may set a first threshold voltage V1, a second threshold voltage V2 and a third threshold voltage V3 to perform a verifying operation on programmed memory cells in a programmed memory cell distribution line 410, where the third threshold voltage V3 is greater than the second threshold voltage V2, and the second threshold voltage V2 is greater than the first threshold voltage V1. The controller of the memory device performs a reading operation on the programmed memory cells according to the first threshold voltage V1, the second threshold voltage V2 and the third threshold voltage V3, and accordingly verify a plurality of charge loss memory cells having a threshold voltage within a range of the first threshold voltage V1 to the third threshold voltage V3.

In FIG. 4B, the controller of the memory device may set a program verifying voltage equal to the third threshold voltage V3, and perform a refill program operation on the charge loss memory cells based on the program verifying voltage being set. A new programmed memory cell distribution line 410' may be generated by performing a charge refill operation on the charge loss memory cells.

Figure 5:
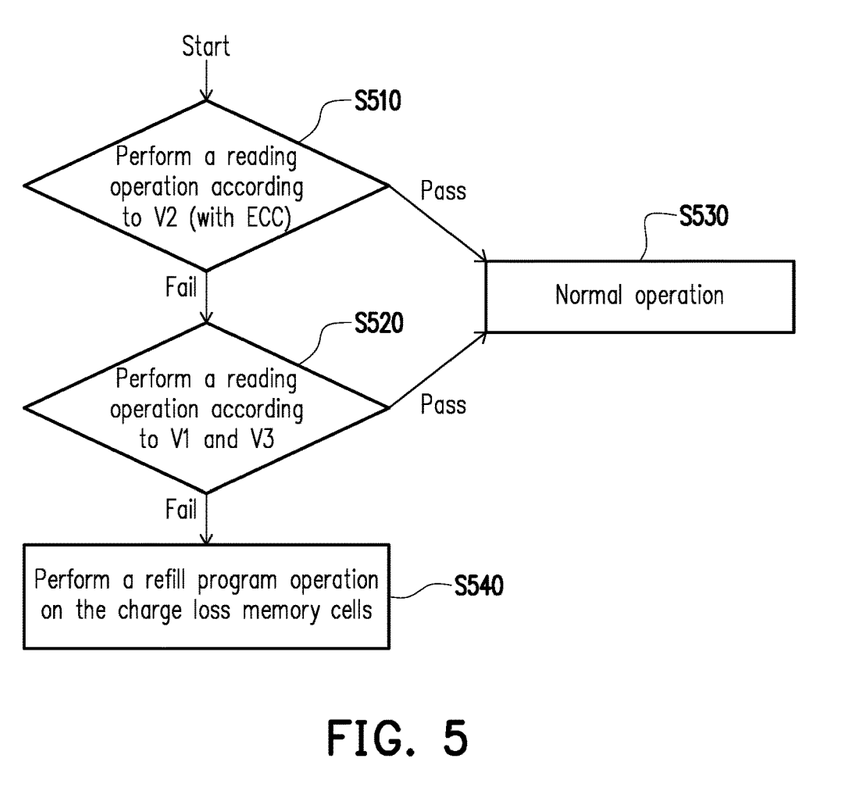
FIG. 5 and FIG. 6 are respectively flowcharts of compensation operations of data retention according to different embodiments of the disclosure.
Figure 6:
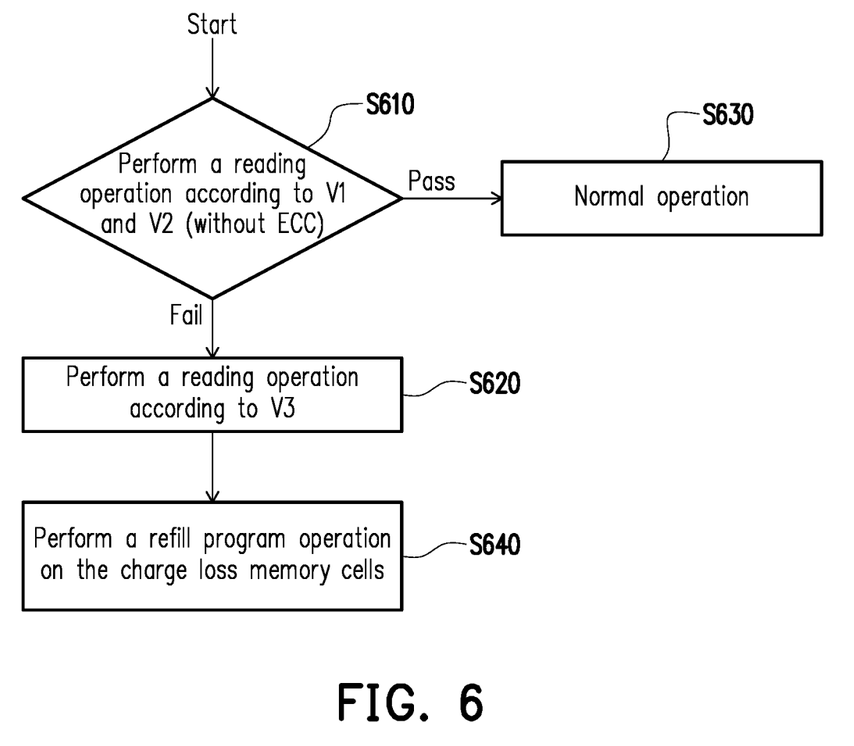

Next, with reference to FIG. 5 and FIG. 6, FIG. 5 and FIG. 6 are respectively flowcharts of compensation operations of data retention according to different embodiments of the disclosure. In FIG. 5, in step S510, a memory device may perform a reading operation on programmed memory cells according to the second threshold voltage V2 by a controller used with an error checking and correction (ECC) mechanism. If the reading operation is passed, it indicates that no serious charge loss phenomenon has occurred in the programmed memory cells, and the programmed memory cells may operate normally (step S530). If the reading operation of step S510 fails, step S520 may be performed, where the memory device may perform a reading operation on the programmed memory cells by the controller according to the first threshold voltage V1 and the third threshold voltage V3, where the third threshold voltage V3 is greater than the second threshold voltage V2, and the second threshold voltage V2 is greater than the first threshold voltage V1.

If the threshold voltage of the programmed memory cells falls within the range of the first threshold voltage V1 to the third threshold voltage V3, the reading result in step S520 fails. Comparatively, if the threshold voltage of the programmed memory cells does not fall within the range of the first threshold voltage V1 to the third threshold voltage V3, the reading result in step S520 is passed. When the reading result in step S520 fails, step S540 may be performed; comparatively, when the reading result of step S520 is passed, step S530 may be performed.

In step S540, the controller of the memory may perform a refill program operation on charge loss memory cells having a threshold voltage within the range of the first threshold voltage V1 to the third threshold voltage V3, and accordingly perform a charge refill operation on the charge loss memory cells.

In FIG. 6, in step S610, a memory device may perform a reading operation on programmed memory cells according to the first threshold voltage V1 and the second threshold voltage V2 by a controller used without an error checking and correcting (ECC) mechanism. If the reading operation is passed, it indicates that no serious charge loss phenomenon has occurred in the programmed memory cells, and the programmed memory cells may operate normally (step S630). If the reading operation of step S610 fails, step S620 may be performed, where the memory device may perform a reading operation on the programmed memory cells by the controller according to the third threshold voltage V3, where the third threshold voltage V3 is greater than the second threshold voltage V2, and the second threshold voltage V2 is greater than the first threshold voltage V1.

Through the reading result in step S620, it is possible to verify charge loss memory cells having a threshold voltage within the range of the first threshold voltage V1 to the third threshold voltage V3. In step S640, the controller of the memory may perform a refill program operation on the charge loss memory cells having threshold voltage within the range of the first threshold voltage V1 to the third threshold voltage V3, and accordingly perform a charge refill operation on the charge loss memory cells.

Figure 7:
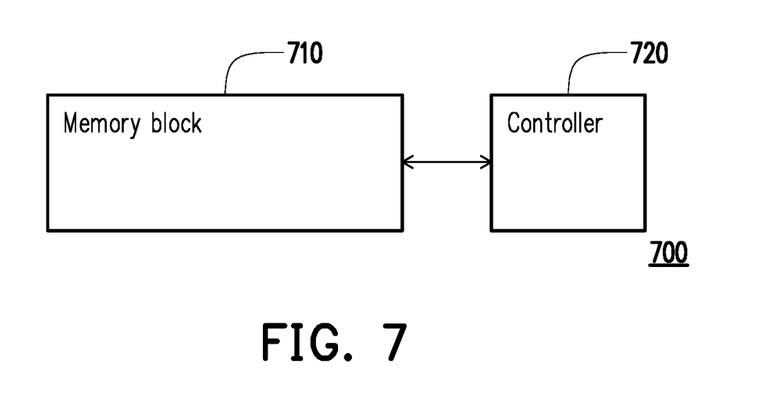
FIG. 7 is a schematic diagram of a memory device according to an embodiment of the disclosure.

Next, with reference to FIG. 7, FIG. 7 is a schematic diagram of a memory device according to an embodiment of the disclosure. A memory device 700 includes a memory block 710 and a controller 720. The memory block 710 and the controller 720 are coupled with each other. The controller 720 is configured to perform, on the memory block 710, the compensation method of data retention of programmed memory cells described in the embodiments above. The relevant operation details have been described in detail in the embodiments above, and will not be described in detail below.

It is worth mentioning that, in the embodiment of the disclosure, the memory block 710 may be an AND or NOR flash memory block. The memory block 710 may be a two-dimensional or three-dimensional memory block. The memory block 710 may have a plurality of regions. Each region may be divided into an erased memory cell block and a programmed memory cell block according to the written state of the memory cells.

In addition, the controller 720 may be a processor with computing capability. Alternatively, the controller 720 may be a hardware circuit designed through a hardware description language (HDL) or any other digital circuit design manner known to those ordinarily skilled in the art, and realized through a field programmable gate array (FPGA), a complex programmable logic device (CPLD) or an application-specific integrated circuit (ASIC), and is not particularly limited.

Figure 8:
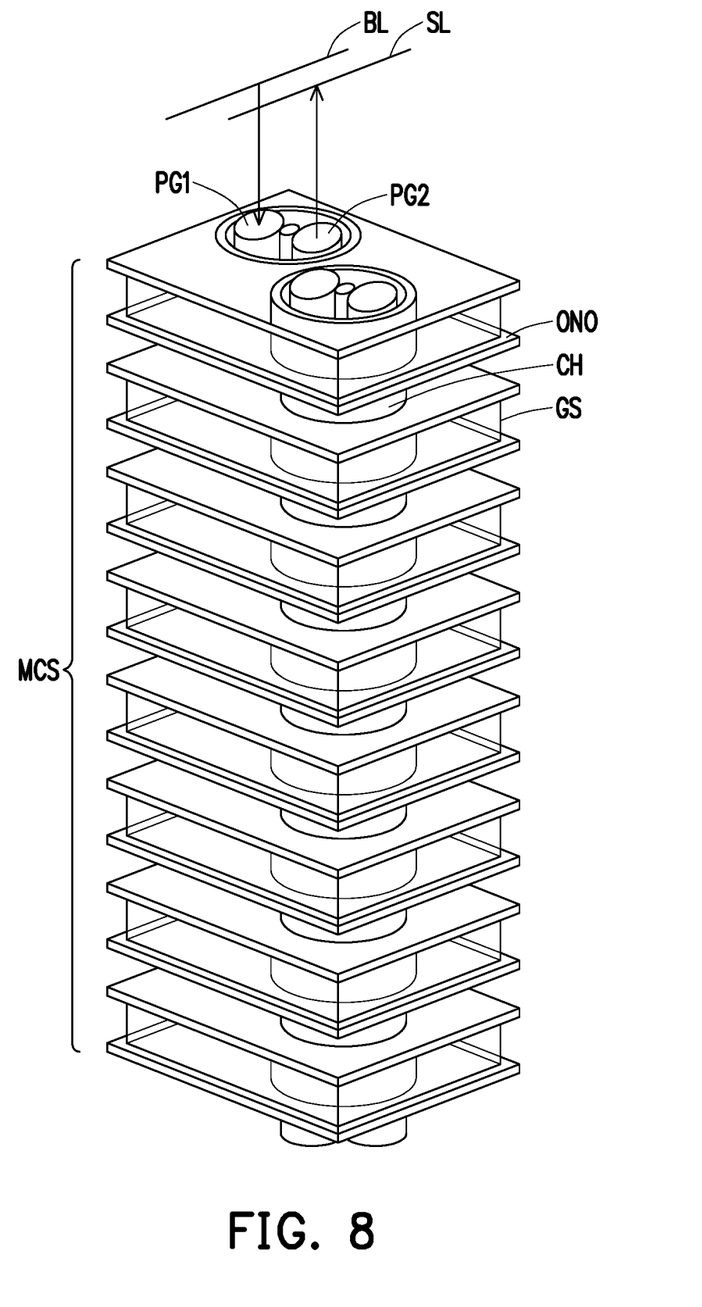
FIG. 8 is a schematic structural view of memory cells of a memory device according to an embodiment of the disclosure.

Next, with reference to FIG. 8, FIG. 8 is a schematic structural view of memory cells of a memory device according to an embodiment of the disclosure. In the memory device of the embodiment of the disclosure, a plurality of memory cells MCs in a memory cell block may be constructed by stacking and form a memory cell string with a three-dimensional structure. Each memory cell may have a silicon oxide-silicon nitride-silicon oxide layer ONO as an insulating layer, and has a channel structure CH and a gate structure GS. A local bit line BL and a local source line SL are respectively connected to all the memory cells MCs in the memory cell string through conductive pins PG1 and PG2.

In summary of the foregoing, according to an embodiment of the disclosure, the memory device determines whether charge loss occurs in the programmed memory cells through the reading operation. In addition, the charge refill operation is performed on the charge loss memory cells through the refill program operation, which may effectively maintain the data retention of the memory cells and ensure the correctness of the data.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A compensation method of data retention, comprising:
    setting a first threshold voltage and a second threshold voltage, where the second threshold voltage is greater than the first threshold voltage;
    performing a reading operation on each of a plurality of programmed memory cells in a memory device, and determining whether a threshold voltage of each of the programmed memory cells falls within a range of the first threshold voltage to the second threshold voltage;
    determining whether a charge loss phenomenon occurs in the programmed memory cells through the reading operation;
    setting the programmed memory cells to be the charge loss memory cells when the threshold voltage of each of the programmed memory cells falls within the range of the first threshold voltage to the second threshold voltage; and
    performing a refill program operation on the charge loss memory cells.

2. The compensation method of claim 1, wherein a step of performing the refill program operation on the charge loss memory cells comprises:
    setting a program verifying voltage in the refill program operation according to the second threshold voltage; and
    performing the refill program operation on the charge loss memory cells according to the program verifying voltage.

3. The compensation method of claim 1, wherein a step of performing the refill program operation on the charge loss memory cells comprises:
    setting a program voltage, and providing a pulse having the program voltage to perform the refill program operation on the charge loss memory cells, where the program voltage is greater than the second threshold voltage.

4. The compensation method of claim 1, wherein a step of performing the refill program operation on the charge loss memory cells comprises:
performing the refill program operation on the charge loss memory cells according to an incremental step pulse programming mechanism.

5. A memory device comprising:
a memory block; and
a controller coupled with the memory block, and being configured to:
set a first threshold voltage and a second threshold voltage, where the second threshold voltage is greater than the first threshold voltage;
perform a reading operation on each of a plurality of programmed memory cells in the memory device;
determine whether a charge loss phenomenon occurs in the programmed memory cells through the reading operation to set the programmed memory cells to be charge loss memory cells by determining whether a threshold voltage of each of the programmed memory cells falls within a range of the first threshold voltage to the second threshold voltage or not
set the programmed memory cells to be the charge loss memory cells when the threshold voltage of each of the programmed memory cells falls within the range of the first threshold voltage to the second threshold voltage; and
perform a refill program operation on the charge loss memory cells.

6. The memory device of claim 5, wherein the controller is further configured to:
set a program verifying voltage in the refill program operation according to the second threshold voltage; and
perform the refill program operation on the charge loss memory cells according to the program verifying voltage.

7. The memory device of claim 5, wherein the controller is further configured to:
set a program voltage, and provide a pulse having the program voltage to perform the refill program operation on the charge loss memory cells,
where the program voltage is greater than the second threshold voltage.

8. The memory device of claim 5, wherein the controller is further configured to:
perform the refill program operation on the charge loss memory cells according to an incremental step pulse programming mechanism.

9. The memory device of claim 5, wherein the memory block is an AND or NOR flash memory block.

10. The memory device of claim 5, wherein the memory block is a two-dimensional or three-dimensional memory block.

11. A compensation method of data retention, comprising:
setting a first threshold voltage, a second threshold voltage, and a third threshold voltage, where the third threshold voltage is greater than the second threshold voltage, and the second threshold voltage is greater than the first threshold voltage
performing a first reading operation on each of the programmed memory cells according to the second threshold voltage based on an error checking and correction mechanism;
performing a second reading operation on each of the programmed memory cells according to the first threshold voltage and the third threshold voltage when the first reading operation fails; and
setting the programmed memory cells having a threshold voltage within a range of the first threshold voltage to the third threshold voltage to be the charge loss memory cells; and
performing a refill program operation on the charge loss memory cells.

12. The compensation method of claim 11, wherein a step of performing the refill program operation on the charge loss memory cells comprises:
setting a program verifying voltage in the refill program operation according to the third threshold voltage; and
performing the refill program operation on the charge loss memory cells according to the program verifying voltage.

13. A compensation method of data retention, comprising:
setting a first threshold voltage, a second threshold voltage, and a third threshold voltage, where the third threshold voltage is greater than the second threshold voltage, and the second threshold voltage is greater than the first threshold voltage;
performing a first reading operation on the memory cells according to the first threshold voltage and the second threshold voltage;
performing a second reading operation on the memory cells according to the third threshold voltage when the first reading operation fails;
setting the programmed memory cells having a threshold voltage within a range of the first threshold voltage to the third threshold voltage to be the charge loss memory cells; and
performing a refill program operation on the charge loss memory cells.

14. A memory device comprising:
a memory block; and
a controller coupled with the memory block, and being configured to:
set a first threshold voltage, a second threshold voltage, and a third threshold voltage, where the third threshold voltage is greater than the second threshold voltage, and the second threshold voltage is greater than the first threshold voltage
perform a first reading operation on each of the programmed memory cells according to the second threshold voltage based on an error checking and correction mechanism;
perform a second reading operation on each of the programmed memory cells according to the first threshold voltage and the third threshold voltage when the first reading operation fails; and
set the programmed memory cells having a threshold voltage within a range of the first threshold voltage to the third threshold voltage to be the charge loss memory cells; and
perform a refill program operation on the charge loss memory cells.

15. The memory device of claim 14, wherein the controller is further configured to:
set a program verifying voltage in the refill program operation according to the third threshold voltage; and
perform the refill program operation on the charge loss memory cells according to the program verifying voltage.

16. A memory device comprising:
a memory block; and
a controller coupled with the memory block, and being configured to:
set a first threshold voltage, a second threshold voltage, and a third threshold voltage, where the third threshold voltage is greater than the second threshold voltage, and the second threshold voltage is greater than the first threshold voltage;
perform a first reading operation on the memory cells according to the first threshold voltage and the second threshold voltage;
perform a second reading operation on the memory cells according to the third threshold voltage when the first reading operation fails;
set the programmed memory cells having a threshold voltage within a range of the first threshold voltage to the third threshold voltage to be the charge loss memory cells; and
perform a refill program operation on the charge loss memory cells.

\* \* \* \* \*